(12) United States Patent
Chan et al.

(10) Patent No.: US 7,101,746 B2
(45) Date of Patent: Sep. 5, 2006

(54) METHOD TO LOWER WORK FUNCTION OF GATE ELECTRODE THROUGH GE IMPLANTATION

(75) Inventors: Tze Ho Simon Chan, Singapore (SG); Mousumi Bhat, Singapore (SG); Jeffrey Chee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/701,963

(22) Filed: Nov. 5, 2003

(65) Prior Publication Data

US 2005/0095773 A1    May 5, 2005

(51) Int. Cl.
*H01L 21/8238* (2006.01)
*H01L 21/336* (2006.01)

(52) U.S. Cl. .............. 438/199; 438/283; 438/301; 438/303; 438/652

(58) Field of Classification Search .......... 438/199, 438/283, 285, 301, 303, 652
See application file for complete search history.

(56) References Cited

U.S. PATENT DOCUMENTS

| 5,356,821 | A | 10/1994 | Naruse et al. ........... 437/34 |
| 5,918,116 | A | 6/1999 | Chittipeddi .............. 438/199 |
| 6,063,670 | A | 5/2000 | Lin et al. ................. 438/275 |
| 6,342,438 | B1 | 1/2002 | Yu et al. .................. 438/520 |
| 6,376,323 | B1 | 4/2002 | Kim et al. ................ 438/373 |
| 6,468,888 | B1 * | 10/2002 | Yu ............................ 438/592 |
| 6,872,608 | B1 * | 3/2005 | Chan et al. .............. 438/176 |
| 2001/0023116 | A1 * | 9/2001 | Wurzer et al. ........... 438/528 |
| 2004/0099916 | A1 * | 5/2004 | Rotondaro et al. ...... 257/412 |

OTHER PUBLICATIONS

Co-pending U.S. Appl. No. 10/697,746, filed on Oct. 30, 2003 to T. H. Chan.
Co-pending U.S. Appl. No. 10/266,425, filed on Oct. 8, 2002 to Chew-Hoe Ang et al.

\* cited by examiner

*Primary Examiner*—Hsien-Ming Lee
(74) *Attorney, Agent, or Firm*—Saile Ackerman LLC; Stephen B. Ackerman

(57) ABSTRACT

A method for forming selective P type and N type gates is described. A gate oxide layer is grown overlying a semiconductor substrate. A polysilicon layer is deposited overlying the gate oxide layer. Germanium ions are implanted into a portion of the polysilicon layer not covered by a mask to form a polysilicon-germanium layer. The polysilicon layer and the polysilicon-germanium layer are patterned to form NMOS polysilicon gates and PMOS polysilicon-germanium gates. In an alternative, nitrogen ions are implanted into the polysilicon-germanium layer and the gates are annealed after patterning to redistribute the germanium ions throughout the polysilicon-germanium layer. In a second alternative, germanium ions are implanted into a first thin polysilicon layer, then a second polysilicon layer is deposited to achieve the total polysilicon layer thickness before patterning the gates.

18 Claims, 6 Drawing Sheets

METHOD TO LOWER WORK FUNCTION OF GATE ELECTRODE THROUGH GE IMPLANTATION

RELATED U.S. PATENT APPLICATION

U.S. patent application Ser. No. 10/697,746 to T. H. Chan et al filed on Oct. 30,2003.

BACKGROUND OF THE INVENTION (1) Field of the Invention

The present invention relates to the fabrication of integrated circuit devices, and more particularly, to a method of selective gate N-type and P-type electrodes using germanium implantation in the fabrication of integrated circuits.

(2) Description of the Prior Art

For 0.1 µm CMOS and below, poly gate depletion is one of the critical issues in achieving high performance devices. Polysilicon-germanium (PolySiGe) is an attractive gate material because of its lower gate depletion and boron penetration and better electron mobility. However, PolySiGe gates degrade NMOS performance while enhancing PMOS performance. The germanium dopant enhances depletion in PMOS and degrades poly depletion in NMOS. It is desired to form NMOS and PMOS gates selectively where N type gates are formed without SiGe and P type gates are formed with SiGe.

U.S. Pat. No. 5,918,116 to Chittipeddi and U.S. Pat. No. 6,063,670 B1 to Lin et al disclose dual gate oxide processes. U.S. Pat. No. 6,342,438 B2 to Yu et al teaches doping PMOS and NMOS regions differently before patterning polysilicon gates. U.S. Pat. No. 5,356,821 to Naruse et al discloses epitaxial growth of SiGe gates for both NMOS and PMOS. U.S. Pat. No. 6,376,323 B1 to Kim et al teaches PolySiGe gates for both PMOS and NMOS with selective doping. Co-pending U.S. patent application Ser. No. 10/266,425 filed on Oct. 8, 2002 discloses a method for forming SiGe gates having different Ge concentrations for PMOS and NMOS. Co-pending U.S. patent application Ser. No. 10/697,746 filed on Oct. 30,2003 discloses a method for forming SiGe gates for PMOS and polysilicon gates for NMOS using a dual deposition and patterning process.

SUMMARY OF THE INVENTION

Accordingly, a primary object of the invention is to provide a process for selective gate formation for N type and P type electrodes in the fabrication of integrated circuits.

A further object of the invention is to provide a process for forming selective gates for N type (without SiGe) and P type (with SiGe) electrodes in the fabrication of integrated circuits.

Another object of the invention is to provide a process for forming selective gates wherein polysilicon-germanium is used for thin P type gates and wherein polysilicon is used for N type gates and thick P type gates.

Yet another object of the invention is to provide a process for forming selective gates wherein polysilicon-germanium is used for thin P type gates and wherein polysilicon is used for N type gates and thick P type gates using a selective Ge implantation process.

A further object of the invention is to provide a process for forming selective gates wherein polysilicon-germanium is used for thin P type gates and wherein polysilicon is used for N type gates and thick P type gates using selective Ge implantation and a split polysilicon process.

A still further object of the invention is to provide a process for forming selective gates wherein polysilicon-germanium is used for thin P type gates and wherein polysilicon is used for N type gates and thick P type gates using a selective Ge implantation and redistribution process.

In accordance with the objects of the invention, a method for forming selective P type and N type gates is achieved. A gate oxide layer is grown overlying a semiconductor substrate. A polysilicon layer is deposited overlying the gate oxide layer. Germanium ions are implanted into a portion of the polysilicon layer not covered by a mask to form a polysilicon-germanium layer. The polysilicon layer and the polysilicon-germanium layer are patterned to form NMOS polysilicon gates and PMOS polysilicon-germanium gates.

Also in accordance with the objects of the invention, another method for forming selective P type and N type gates is achieved. A gate oxide layer is grown overlying a semiconductor substrate. A polysilicon layer is deposited overlying the gate oxide layer. Germanium ions are implanted into a portion of the polysilicon layer not covered by a mask to form a polysilicon-germanium layer. Nitrogen ions are implanted into the polysilicon-germanium layer. The polysilicon layer and the polysilicon-germanium layer are patterned to form NMOS polysilicon gates and PMOS polysilicon-germanium gates. The gates are annealed to redistribute the germanium ions through the polysilicon-germanium layer of the PMOS polysilicon-germanium gates.

Also in accordance with the objects of the invention, another method for forming selective P type and N type gates is achieved. A gate oxide layer is grown overlying a semiconductor substrate. A first polysilicon layer is deposited overlying the gate oxide layer. Germanium ions are implanted into a portion of the first polysilicon layer not covered by a mask to form a polysilicon-germanium layer. A second polysilicon layer is deposited over the first polysilicon layer and the polysilicon-germanium layer. The second polysilicon layer, first polysilicon layer, and the polysilicon-germanium layer are patterned to form NMOS polysilicon gates and PMOS polysilicon-germanium gates.

BRIEF DESCRIPTION OF THE DRAWINGS

In the accompanying drawings forming a material part of this description, there is shown.

DESCRIPTION OF THE PREFERRED EMBODIMENTS

Three preferred embodiments of the present invention are to be described. The first preferred embodiment, illustrated in FIGS. 1–6, comprises a selective Ge implantation process. The second preferred embodiment, illustrated in FIGS. 7–11, comprises a selective Ge implantation with redistribution process. The third preferred embodiment, illustrated in FIGS. 12–17, is a selective Ge implantation and split polysilicon process.

Figure 1:
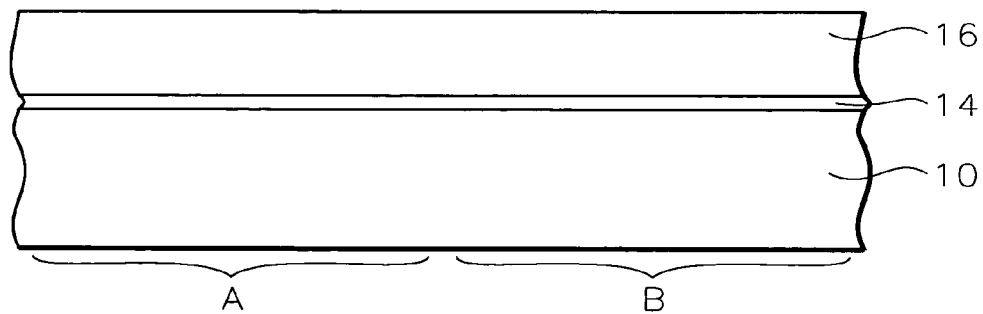
FIGS. 1 through 5 are cross-sectional representations of a first preferred embodiment of the present invention.

The first preferred embodiment will now be described with reference to FIGS. 1–6. Referring now more particularly to FIG. 1, there is shown a semiconductor substrate 10. This is preferably monocrystalline silicon. Isolation regions, such as shallow trench isolation (STI), not shown, are formed in the substrate to separate active regions. In the figures, an active region A for thick gate devices will be shown on the left and an active region B for thin gate devices will be shown on the right. For example, thick gate devices have a gate width of more than about 2400 Angstroms. Examples of thick gate devices are 2.5V input/output devices. Thin gate devices have a gate width of less than about 800 Angstroms. Examples of thin gate devices are 1.0V low threshold voltage devices.

A thermal gate oxide layer 14 is grown on the surface of the substrate to a thickness of between about 12 and 20 Angstroms. A polysilicon layer 16 is deposited overlying the gate oxide layer to a thickness of between about 1500 and 2000 Angstroms.

Figure 2:
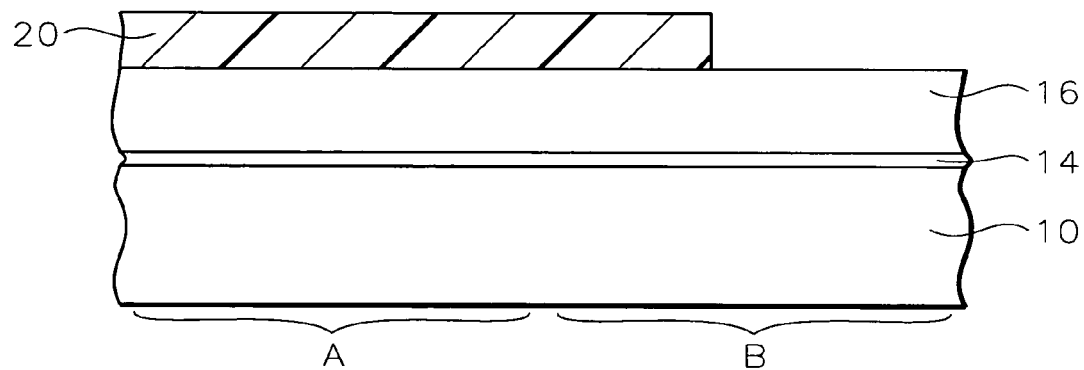

Referring now to FIG. 2, a mask 20 covers the regions not requiring polysilicon-germanium gates. Thick gate performance is not badly degraded, so the polysilicon-germanium gates are required only in the thin gate area B.

Figure 3:
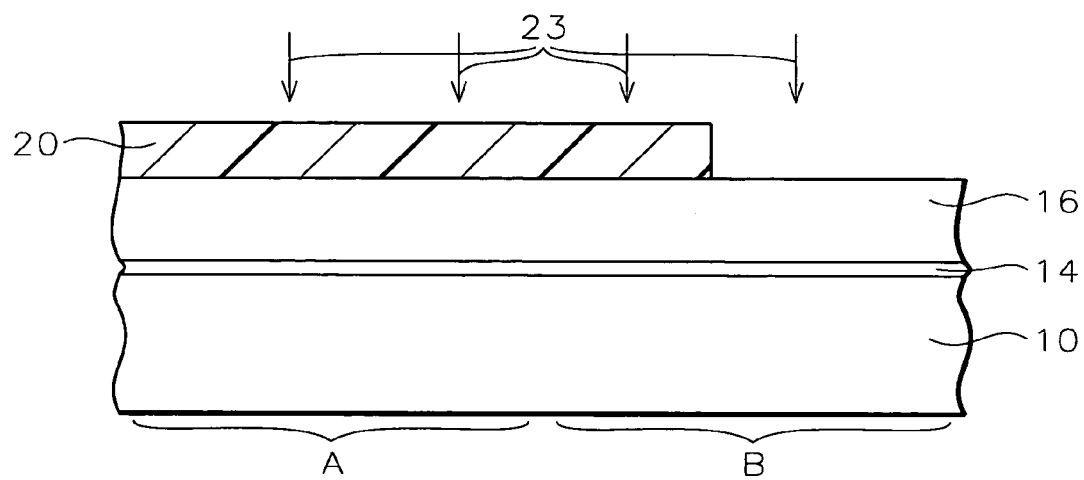

Referring now to FIG. 3, germanium ions are implanted 25 into the polysilicon layer 16 not covered by the mask 20. Preferably, germanium ions are implanted using a heavy dose of between about 1E13 and 2E13 ions/cm$^2$ at an energy of between about 20 and 80 KeV.

Figure 4:
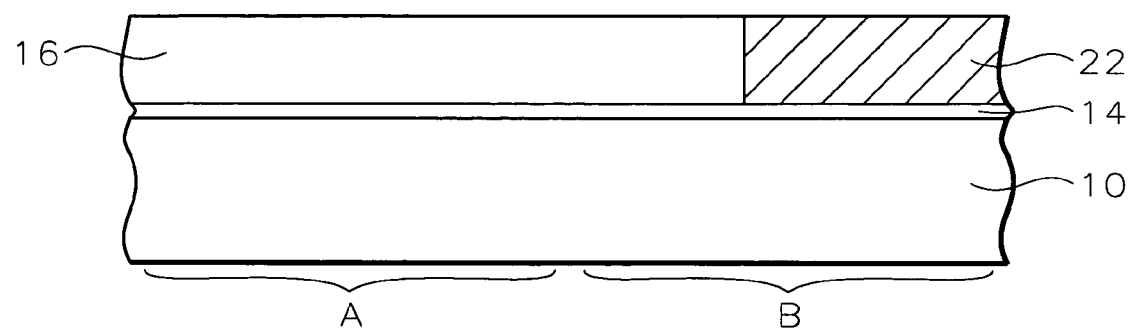

Now, the implantation mask 20 is stripped as shown in FIG. 4. The portion 22 of the polysilicon layer is now polySiGe.

Figure 5:
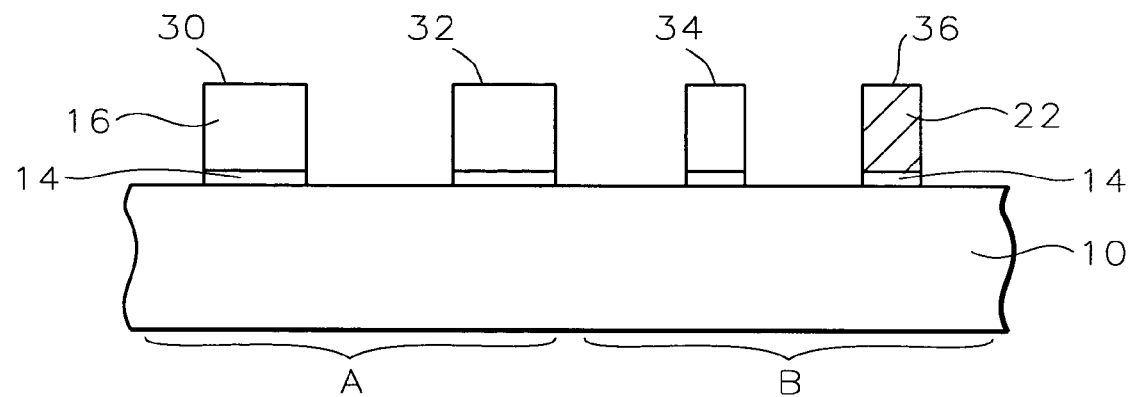

An etching mask, not shown, is formed over the gate layers to define thick and thin gate electrodes. The polysilicon 16 and PolySiGe 22 layers are etched away where they are not covered by the mask pattern to form gate electrodes as shown in FIG. 5. In the thick device area A, polysilicon NMOS gate electrode 30 and polysilicon PMOS gate electrode 32 have been formed. In the thin device area B, polysilicon NMOS gate electrode 34 has been formed and PolySiGe PMOS gate electrode 36 has been formed. For example, the thick NMOS and PMOS gates have a width of more than about 3000 Angstroms, the thin NMOS gates have a width of less than about 60 Angstroms, and the PMOS PolySiGe gates have a width of less than about 90 Angstroms.

Figure 6:
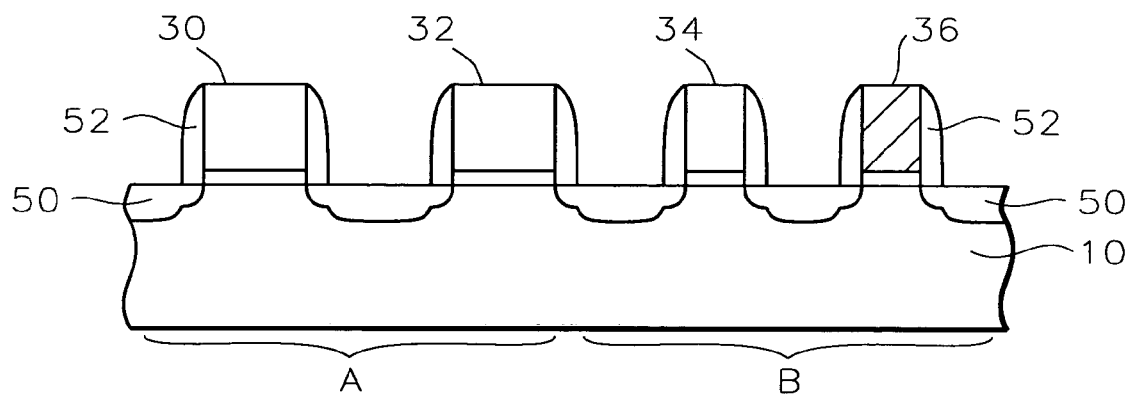
FIG. 6 is a cross-sectional representation of a completed integrated circuit fabricated according to a first preferred embodiment of the present invention.

FIG. 6 illustrates the completed gate electrode devices having associated source/drain regions 50 and dielectric sidewall spacers 52.

The second preferred embodiment will now be described with reference to FIGS. 1–3 and 7–10. The second embodiment begins as in the first embodiment up to the implantation of germanium ions 23 as shown in FIG. 3. In this embodiment, preferably, germanium ions are implanted using a$_2$ heavy dose of between about 1E13 and 2E13 ions/cm at an energy of between about 20 and 80 KeV.

Figure 7:
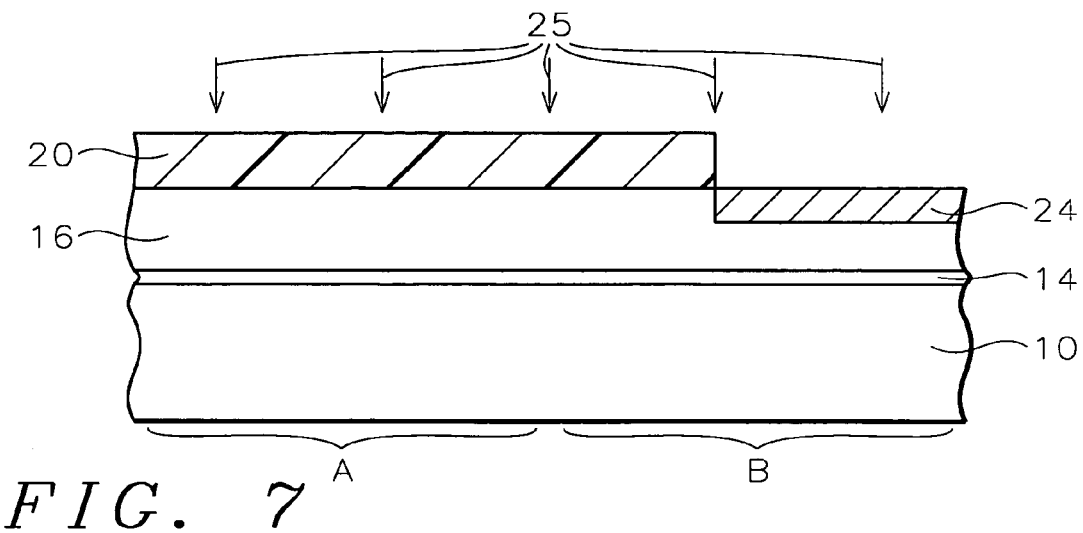
FIGS. 7 through 10 are cross-sectional representations of a second preferred embodiment of the present invention.

FIG. 7 illustrates the germanium implanted region 24. Now, nitrogen ions are implanted 25 into the germanium implanted region 24 not covered by the mask 20. Preferably, nitrogen ions are implanted using a heavy dose of between about 1E13 and 4E13 ions/cm$^2$ at an energy of between about 10 and 100 KeV.

Figure 8:
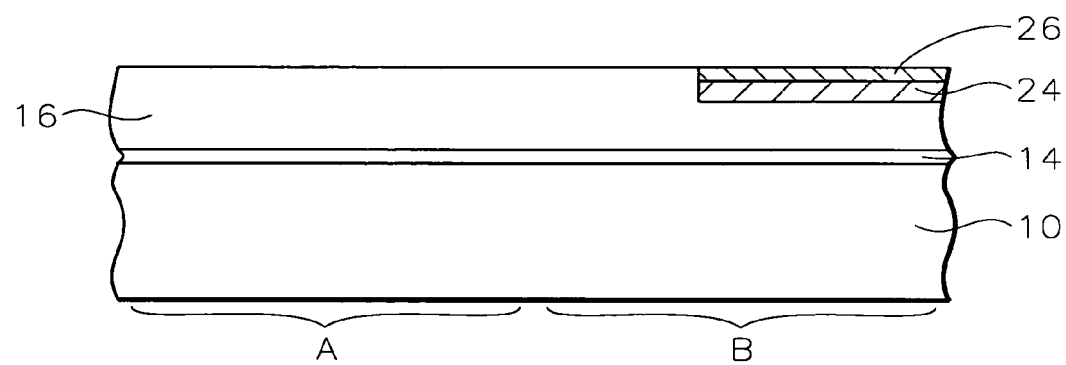

Now, the implantation mask 20 is stripped as shown in FIG. 8. Nitrogen implanted region 26 is shown in the top portion of the germanium implanted region 24.

Figure 9:
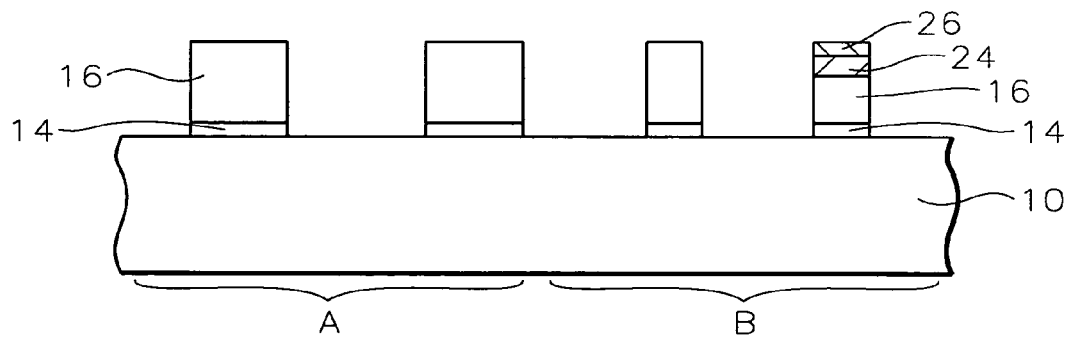

An etching mask, not shown, is formed over the gate layers to define thick and thin gate electrodes. The polysilicon 16 and PolySiGe/polysilicon 26/24/16 layers are etched away where they are not covered by the mask pattern to form gate electrodes as shown in FIG. 9.

Figure 10:
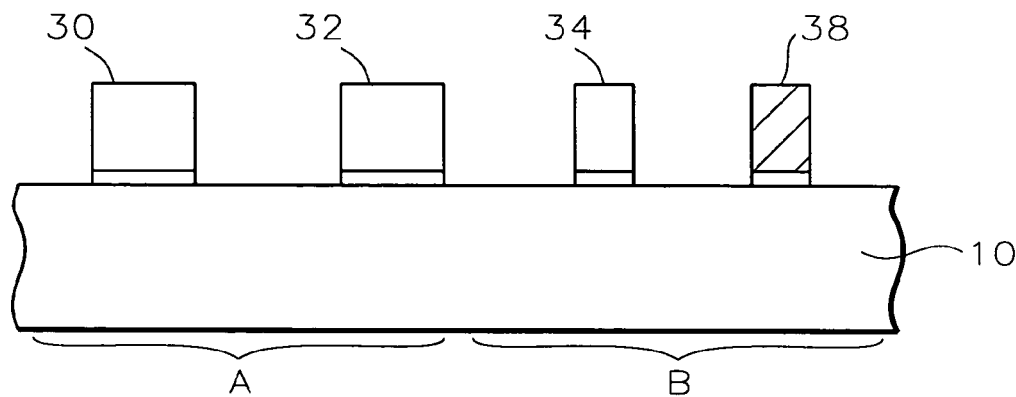

Now, a redistribution annealing is performed to diffuse the germanium throughout the polysilicon layer of the thin PMOS gate. Preferably, the wafer is annealed in an inert ambient at a temperature of between about 800 and 1200° C. for 30 to 120 minutes. The nitrogen dopants, having larger mass, cause the germanium dopants to redistribute. As shown in FIG. 10, in the thick device area A, polysilicon NMOS gate electrode 30 and polysilicon PMOS gate electrode 32 have been formed. In the thin device area B, polysilicon NMOS gate electrode 34 has been formed and PolySiGe PMOS gate electrode 38 has been formed. For example, the thick NMOS and PMOS gates have a width of more than about 3000 Angstroms, the thin NMOS gates have a width of less than about 60 Angstroms, and the PMOS PolySiGe gates have a width of less than about 90 Angstroms.

Figure 11:
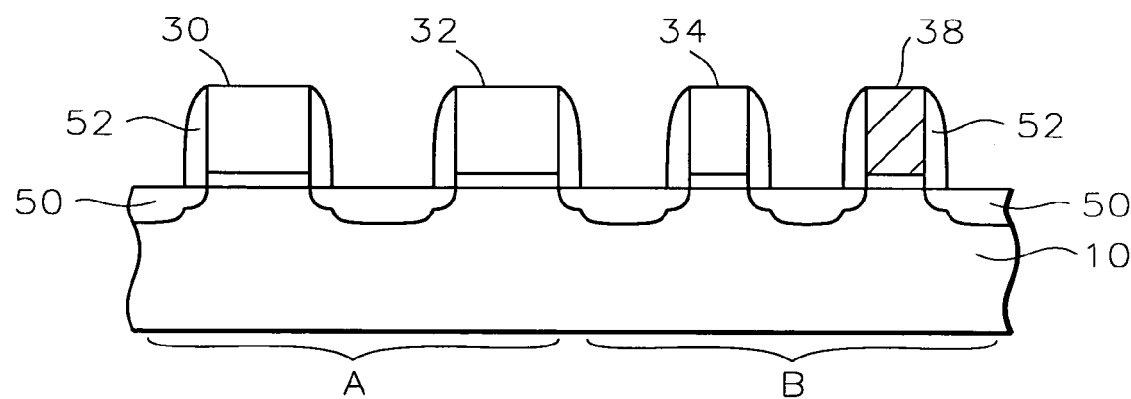
FIG. 11 is a cross-sectional representation of a completed integrated circuit fabricated according to a second preferred embodiment of the present invention.

FIG. 11 illustrates the completed gate electrode devices having associated source/drain regions 50 and dielectric sidewall spacers 52.

Figure 12:
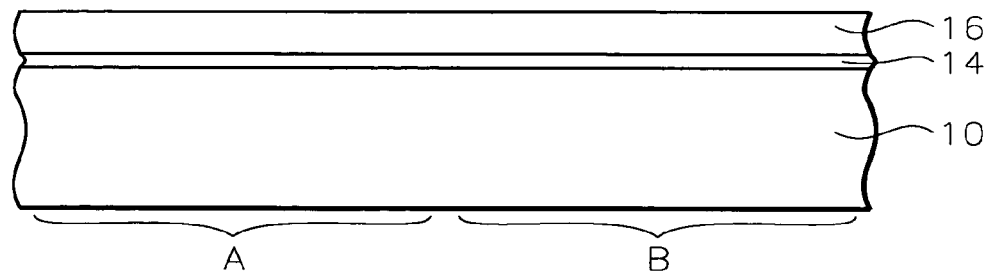
FIGS. 12 through 16 are cross-sectional representations of a third preferred embodiment of the present invention.

The third preferred embodiment will now be described with reference to FIGS. 12–16. Referring now more particularly to FIG. 12, there is shown a semiconductor substrate 10. This is preferably monocrystalline silicon. Isolation regions, such as shallow trench isolation (STI), not shown, are formed in the substrate to separate active regions. In the figures, an active region A for thick gate devices will be shown on the left and an active region B for thin gate devices will be shown on the right.

A thermal gate oxide layer 12 is grown on the surface of the substrate to a thickness of between about 12 and 20 Angstroms. Since high implanted germanium concentrations are difficult to achieve, this embodiment utilizes a split polysilicon process. A thin polysilicon layer will be deposited, germanium will be implanted, and then the remaining polysilicon will be deposited. A first polysilicon layer 16 is deposited overlying the gate oxide layer to a thickness of between about 500 and 2000 Angstroms.

Figure 13:
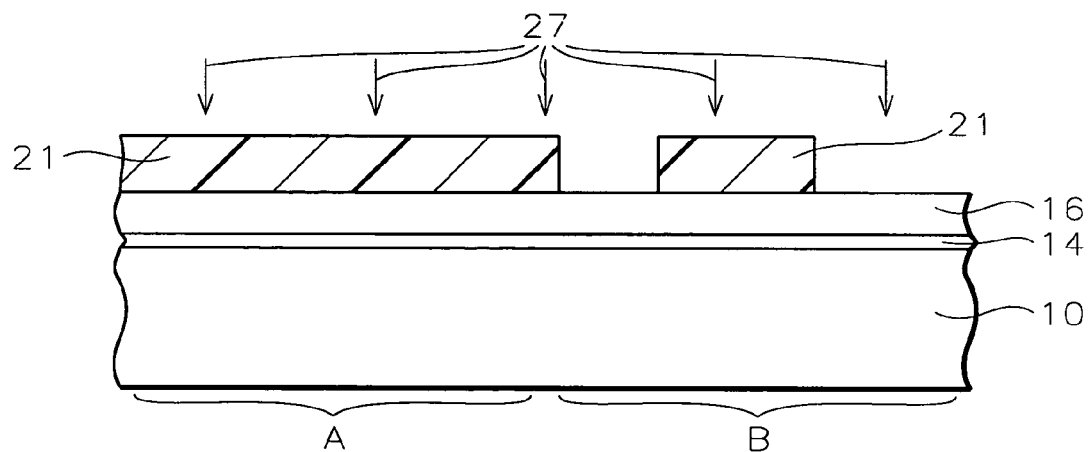

Referring now to FIG. 13, a mask 21 covers the regions not requiring polysilicon-germanium gates. This includes all of the thick gate area A and a portion of the thin gate area B. Now, germanium ions are implanted 27 as shown in FIG. 13. Preferably, germanium ions are implanted using a heavy dose of between about 1E13 and 2E13 ions/cm$^2$ at an energy of between about 20 and 50 KeV.

Figure 14:
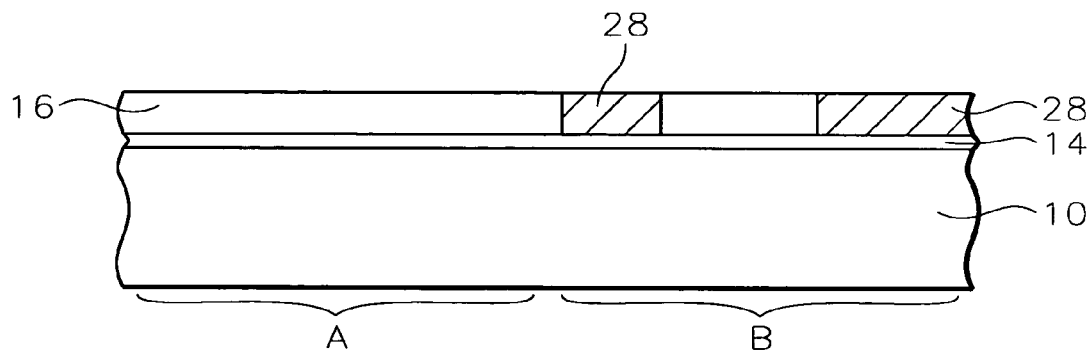
Figure 15:
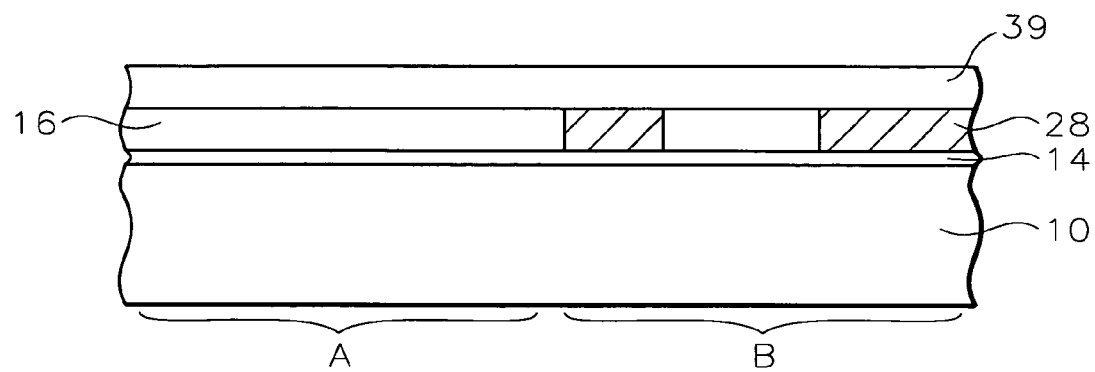
Figure 16:
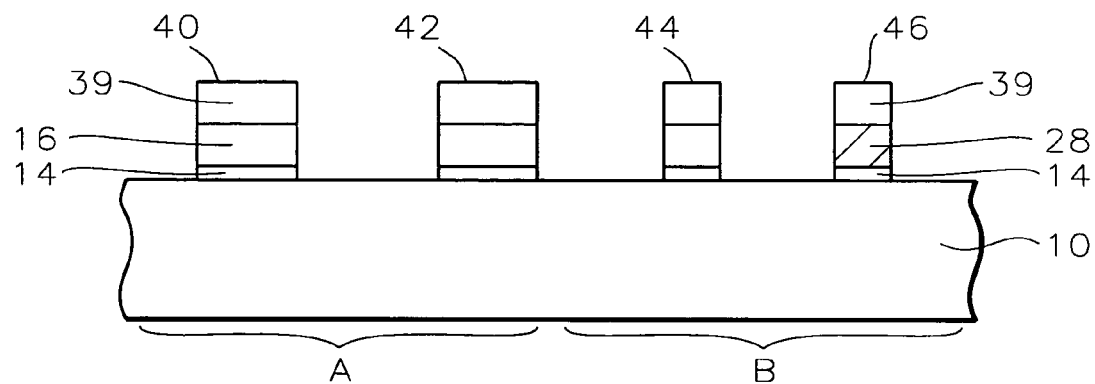

Now, the implantation mask 21 is stripped as shown in FIG. 14. Germanium implanted regions 28 are shown. Referring now to FIG. 15, a second polysilicon layer 39 is deposited over the first polysilicon layer to a thickness of between about 1000 and 2000 Angstroms. An etching mask, not shown, is formed over the gate layers to define thick and thin gate electrodes. The polysilicon 39/16 and PolySiGe/polysilicon 39/28/16 layers are etched away where they are not covered by the mask pattern to form gate electrodes as shown in FIG. 16. In the thick device area A, polysilicon NMOS gate electrode 40 and polysilicon PMOS gate electrode 42 have been formed. In the thin device area B, polysilicon NMOS gate electrode 44 has been formed and PolySiGe PMOS gate electrode 46 has been formed. For example, the thick NMOS and PMOS gates have a width of more than about 3000 Angstroms and the thin NMOS gates and the PMOS PolySiGe gates have a width of less than about 90 Angstroms.

Figure 17:
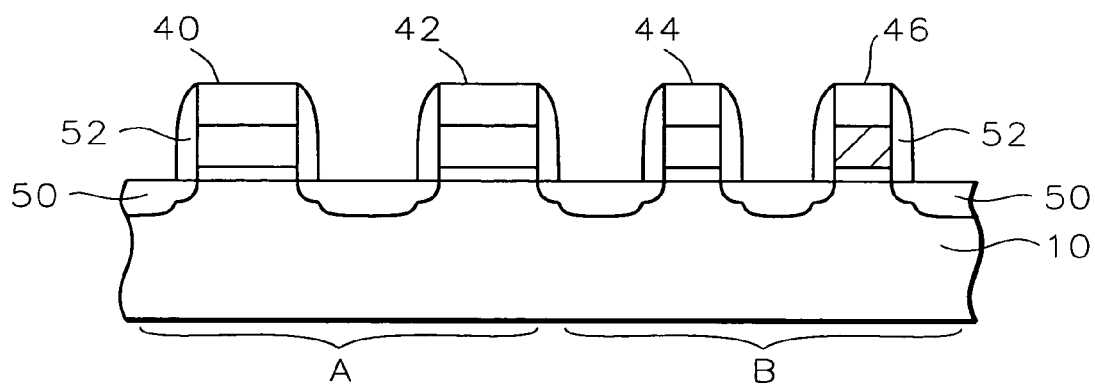
FIG. 17 is a cross-sectional representation of a completed integrated circuit fabricated according to a third preferred embodiment of the present invention.

FIG. 17 illustrates the completed gate electrode devices having associated source/drain regions 50 and dielectric sidewall spacers 52.

The process of the present invention provides a simple, manufacturable dual gate process. For optimum performance, thick gate devices have polysilicon gate electrodes while thin PMOS devices are PolySiGe gate electrodes. Three methods have been described to form polysilicon-germanium thin PMOS gates by germanium implantation.

While the invention has been particularly shown and described with reference to the preferred embodiments thereof, it will be understood by those skilled in the art that various changes in form and details may be made without departing from the spirit and scope of the invention.

What is claimed is:

1. A method of forming dual gates in the fabrication of an integrated circuit device comprising:
   growing a gate oxide layer overlying a substrate;
   depositing a polysilicon layer overlying said gate oxide layer;
   implanting germanium ions into a portion of said polysilicon layer not covered by a mask to form a polysilicon-germanium layer; and
   patterning said polysilicon layer and said polysilicon-germanium layer to form NMOS polysilicon gates and PMOS polysilicon-germanium gates wherein said NMOS polysilicon gates are thick NMOS gates having a width of more than 2400 Angstroms and thin NMOS gates having a width of less than 800 Angstroms and wherein said PMOS polysilicon-germanium gates are thin PMOS gates having a width of less than 800 Angstroms.

2. The method according to claim 1 wherein said gate oxide layer is grown to a thickness of between about 12 and 20 Angstroms.

3. The method according to claim 1 wherein said polysilicon layer is deposited to a thickness of between about 1500 and 2000 Angstroms.

4. The method according to claim 1 wherein said germanium ions are implanted at a dosage of between about 1E13 and 2E13 ions/cm$^2$ at an energy of between about 20 and 80 KeV.

5. The method according to claim 1 wherein said thick NMOS gates have a width of more than about 3000 Angstroms, said thin NMOS gates have a width of less than about 60 Angstroms and said thin PMOS gates have a width of less than about 90 Angstroms and further comprising patterning said polysilicon layer to form thick PMOS gates having a width of more than about 2400 Angstroms.

6. A method of forming dual gates in the fabrication of an integrated circuit device comprising:
   growing a gate oxide layer overlying a substrate;
   depositing a polysilicon layer overlying said gate oxide layer;
   implanting germanium ions into a portion of said polysilicon layer not covered by a mask to form a polysilicon-germanium layer;
   thereafter implanting nitrogen ions into said polysilicon-germanium layer;
   patterning said polysilicon layer and said polysilicon-germanium layer to form NMOS polysilicon gates and PMOS polysilicon-germanium gates; and
   thereafter annealing said substrate wherein said germanium ions are redistributed throughout said polysilicon-germanium layer in said polysilicon-germanium PMOS gate in the fabrication of an integrated circuit device.

7. The method according to claim 6 wherein said gate oxide layer is grown to a thickness of between about 12 and 20 Angstroms.

8. The method according to claim 6 wherein said polysilicon layer is deposited to a thickness of between about 1500 and 2000 Angstroms.

9. The method according to claim 6 wherein said germanium ions are implanted at a dosage of between about 1E13 and 2E13 ions/cm$^2$ at an energy of between about 20 and 50 KeV.

10. The method according to claim 6 wherein said nitrogen ions are implanted at a dosage of between about 1E13 and 4E13 ions/cm$^2$ at an energy of between about 10 and 120 KeV.

11. The method according to claim 6 wherein said step of annealing said substrate comprises annealing in an inert ambient at a temperature of between about 800 and 1200° C. for 30 to 120 minutes.

12. The method according to claim 6 wherein said NMOS polysilicon gates are thick NMOS gates having a width of more than about 3000 Angstroms and thin NMOS gates having a width of less than about 60 Angstroms and wherein said PMOS polysilicon-germanium gates are thin PMOS gates having a width of less than about 90 Angstroms and further comprising patterning said polysilicon layer to form thick PMOS gates having a width of more than about 3000 Angstroms.

13. A method of forming dual gates in the fabrication of an integrated circuit device comprising:
   growing a gate oxide layer overlying a substrate;
   depositing a first polysilicon layer overlying said gate oxide layer;
   implanting germanium ions into a portion of said first polysilicon layer not covered by a mask to form a polysilicon-germanium layer;
   thereafter depositing a second polysilicon layer overlying said first polysilicon layer and said polysilicon-germanium layer; and
   patterning said second polysilicon layer, said first polysilicon layer, and said polysilicon-germanium layer to form NMOS polysilicon gates and PMOS polysilicon-germanium gates
   wherein said NMOS polysilicon gates are thick NMOS gates having a width of more than 2400 Angstroms and thin NMOS gates having a width of less than 800 Angstroms and wherein said PMOS polysilicon-germanium gates are thin PMOS gates having a width of less than 800 Angstroms.

14. The method according to claim 13 wherein said gate oxide layer is grown to a thickness of between about 12 and 20 Angstroms.

15. The method according to claim 13 wherein said first polysilicon layer is deposited to a thickness of between about 500 and 2000 Angstroms.

16. The method according to claim 13 wherein said germanium ions are implanted at a dosage of between about 1E13 and 2E13 ions/cm$^2$ at an energy of between about 20 and 50 KeV.

17. The method according to claim 13 wherein said second polysilicon layer is deposited to a thickness of between about 1000 and 2000 Angstroms.

18. The method according to claim 13 wherein said thick NMOS gates have a width of more than about 3000 Angstroms, said thin NMOS gates have a width of less than about 60 Angstroms and said thin PMOS gates have a width of less than about 90 Angstroms and further comprising patterning said polysilicon layer to form thick PMOS gates having a width of more than about 2400 Angstroms.

* * * * *